US006552288B2

(12) United States Patent
Ono

(10) Patent No.: US 6,552,288 B2
(45) Date of Patent: Apr. 22, 2003

(54) INPUT DEVICE FOR GAME CONTROLLER

(75) Inventor: Atsushi Ono, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 77 days.

(21) Appl. No.: 09/796,459

(22) Filed: Mar. 2, 2001

(65) Prior Publication Data

US 2001/0019323 A1 Sep. 6, 2001

(30) Foreign Application Priority Data

Mar. 31, 2000 (JP) ....................................... 2000-096683

(51) Int. Cl.[7] ............................................ H03K 17/975
(52) U.S. Cl. ........................ 200/512; 200/181; 200/600
(58) Field of Search ........................... 200/512–17, 181, 200/600; 338/47

(56) References Cited

U.S. PATENT DOCUMENTS 4,493,219 A * 1/1985 Sharp et al. .............. 338/47 X
4,659,879 A * 4/1987 Hasegawa ............... 200/517 X
5,115,106 A * 5/1992 Weiland et al. ............. 200/512
5,212,473 A * 5/1993 Louis ......................... 200/513
5,666,112 A * 9/1997 Crowley et al. ........ 200/512 X

* cited by examiner

*Primary Examiner*—Renee Luebke
(74) *Attorney, Agent, or Firm*—Whitham, Curtis & Christofferson, PC

(57) ABSTRACT

A first electrode and a second electrode are disposed on a base board. A resist is formed on the base board so as to cover the first electrode. A capacitance-operated silicon rubber sensor is provided on the base board so as to cover the resist and the second electrode. A click rubber is disposed above the silicon rubber sensor. A button deforms the click rubber so as to press down the silicon rubber sensor and the resist. The silicon rubber sensor and the resist generates an analog output signal between the first and second electrodes in proportion to a force pressing the button, when the pressing force is larger than a predetermined pressing force enough to deform the click rubber so as to establish the output signal.

8 Claims, 3 Drawing Sheets

INPUT DEVICE FOR GAME CONTROLLER

BACKGROUND OF THE INVENTION

The present invention relates to an input device for a game controller, and more particularly to the input device for the game controller in which both a digital and an analog output can be generated by means of a compact and simple trigger button type switch.

A related input device for a game controller of this type will be explained referring to FIG. 5. The input device 1 for the game controller consists of a base board 4 on which a pair of electrodes 2 and 3 are fixed, a click rubber 5 rigidly provided on the base board 4, a button 6 placed on the click rubber 5, and a casing 7 which covers the click rubber 5 and the button 6. The casing 7 is substantially an inverted shape of a bottomed cylinder, and is provided with an opening 7*a* at its upper end part. The click rubber 5 is formed of elastic material and composed of a cylindrical body 5*a* in a substantially cylindrical shape, extending portions 5*b* which extend from the cylindrical body 5*a* diagonally downward, and leg portions 5*c* disposed at lower ends of the extending portions 5*b*. A conductive body 5*d* is fixed to a lower end part of the cylindrical body 5*a*.

The leg portions 5*c* are fixed to the base board 4, and at the same time, support a lower end part of the casing 7. The button 6 consists of an upper small-diameter portion 6*a* in a cylindrical shape which is smaller in diameter than the opening 7*a,* and a lower large-diameter portion 6*b* in a cylindrical shape which is larger in diameter than the opening 7*a*. The upper small-diameter portion 6*a* is arranged so as to pass through the opening 7*a* formed in the casing 7 and project upward from the casing 7, while the lower large-diameter portion 6*b* is disposed inside the upper end part of the casing 7, and biased in an upward direction by means of the click rubber 5.

When the button 6 is pushed down, the extending portions 5*b* of the click rubber 5 are deformed with the push motion of the button 6 to move the cylindrical body 5*a* of the click rubber 5 downward. By further pushing the button 6 downward, the extending portions 5*b* are greatly deformed instantaneously bringing the conductive body 5*d* fixed to the lower end part of the cylindrical body 5*a* into contact with the electrodes 2 and 3 thereby to establish electrical conduction between the electrodes 2 and 3. Moreover, when the extending portions 5*b* are greatly deformed instantaneously, an operator of the button 6 can feel a touch of a click, and the operator can confirm from the touch of the click that the electrical conduction has been established between the electrodes 2 and 3.

In the related input device for the game controller, when the button is pushed downward, the click rubber located below the button is deformed by the push motion of the button, and the cylindrical body of the click rubber moves downward, whereby the conductive body fixed to the cylindrical body allows a pair of the electrodes provided on the base board to be electrically conducted. However, this input device for the game controller has been insufficient in function to act as the input device for the game controller, since it has only an "on" and "off" switching function of the electrodes.

SUMMARY OF THE INVENTION

It is therefore an object of the present invention to provide a button type input device for the game controller in which an analog output can be generated in accordance with the push-down operation of the button, as well as the on/off switching function in order to improve the function of the controller.

According to one preferred embodiment of the invention, an input device includes a base board with first and second electrodes disposed thereon. A resist covers the first electrode and a capacitance-operated sensor is mounted on the resist and covers the second electrode. A click rubber with deformable extending portions is positioned above the capacitance-operated sensor. A button translatable within an aperture in a casing is mounted on top of the click rubber, where the casing covers the sensor, the click rubber and a portion of the button.

Here, the silicon rubber sensor and the resist generates an analog output signal between the first and second electrodes in proportion to a force pressing the button, when the pressing force is larger than a predetermined pressing force enough to deform the click rubber so as to establish the output signal.

According to another preferred embodiment of the invention, the input device includes a base board with first and second electrodes disposed thereon, and a piezoelectric sensor disposed on the base board so as to cover the electrodes. A click rubber with deformable extending portions is positioned above the piezoelectric sensor. A button translatable within an aperture in a casing is mounted on top of the click rubber, where the casing covers the sensor, the click rubber and a portion of the button.

Here, the piezoelectric sensor generates an analog output signal between the first and second electrodes in proportion to a force pressing the button, when the pressing force is larger than a predetermined pressing force enough to deform the click rubber so as to establish the output signal.

In the above configurations, the "on" and "off" operation can be effected by the button operation, and at the same time, the analog output can be generated in correspondence with the push-down operation of the button.

DETAILED DESCRIPTION OF THE PREFERRED EMBODIMENTS

Figure 1:
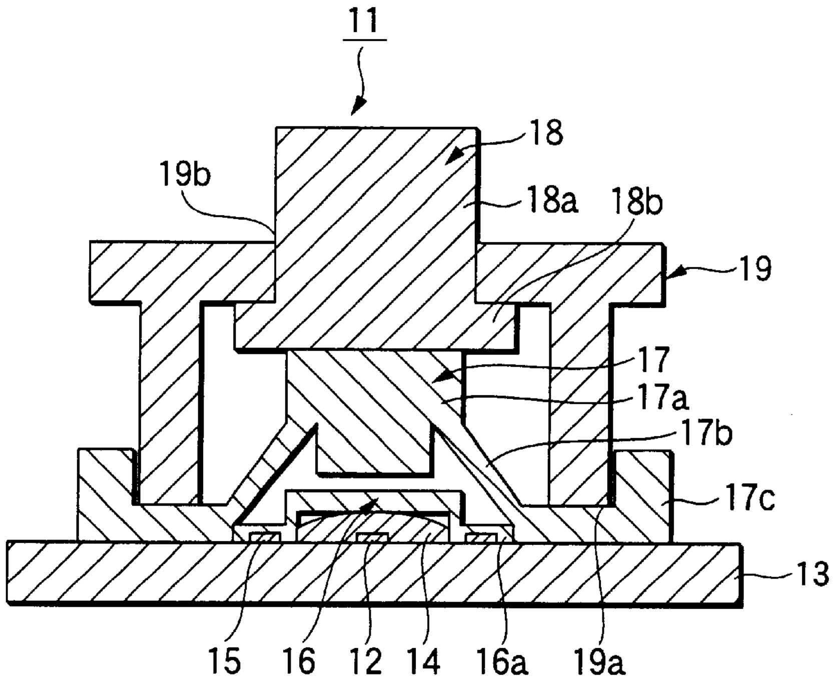
FIG. 1 is a sectional side view of an input device for a game controller according to a first embodiment of the invention, showing a state before a button is pushed.
Figure 2:
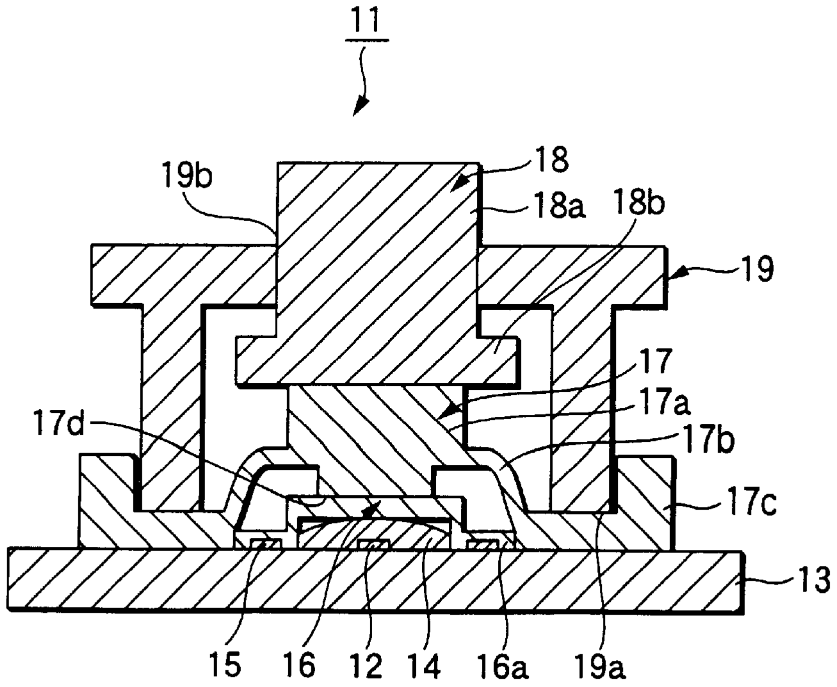
FIG. 2 is a sectional side view of the input device of FIG. 1, showing a state where the button is pushed down and the click rubber is greatly deformed.
Figure 3:
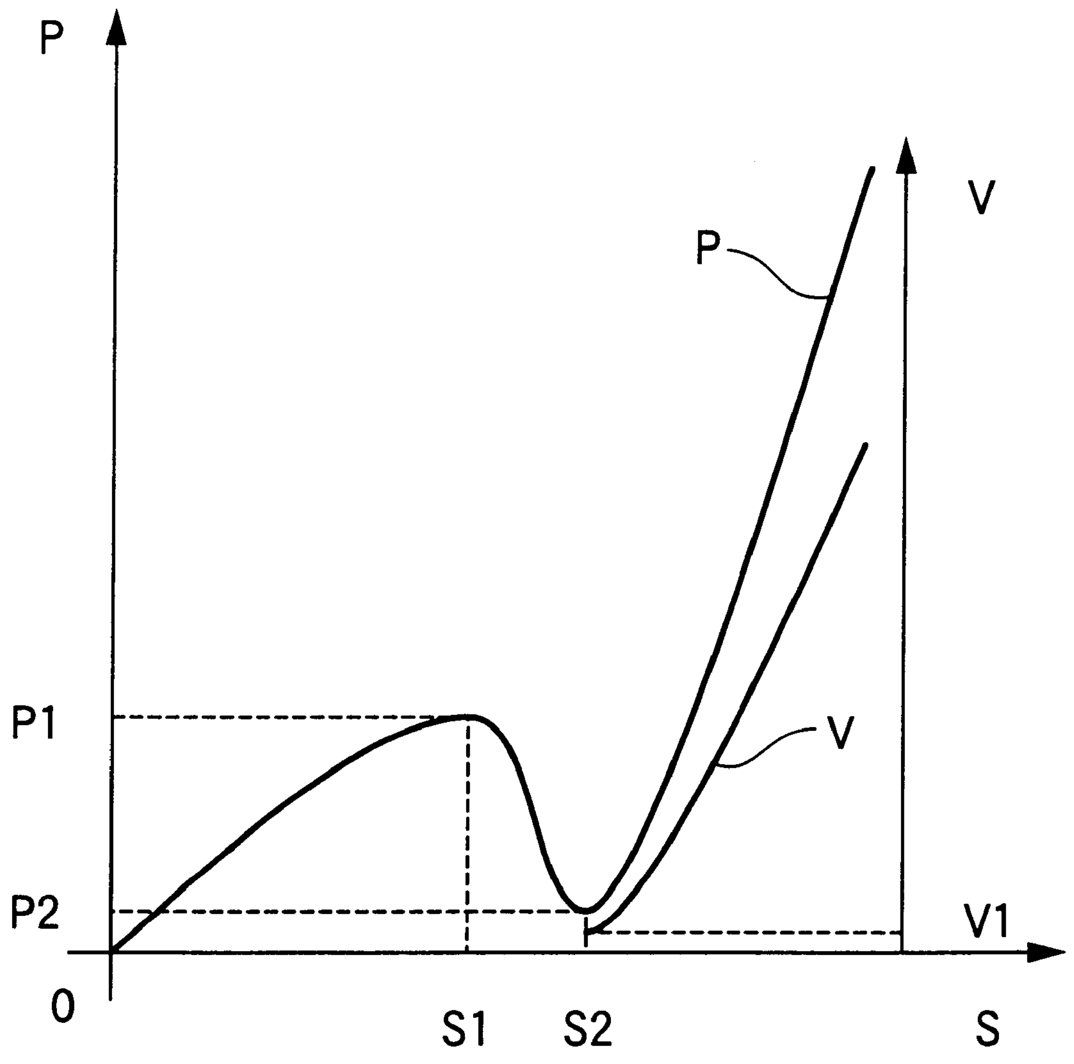
FIG. 3 is a graph showing the relation among a displaced amount of the button, a load of a touch which an operator of the button feels, and an output of the electrodes.

There will be described in detail preferred embodiments of the invention with reference to the accompanying drawings. FIGS. 1 to 3 show an input device for a game controller 11 according to a first embodiment of the invention. The input device 11 includes: a base board 13 on which electrodes 12 and 15 are fixed; a resist 14 fixed on the base board 13 which covers the electrode 12; a capacitance-operated silicone rubber sensor 16 made of carbon containing silicone rubber which is mounted on the resist 14 and covers the electrode 15; a click rubber 17 positioned apart from and above the silicone rubber sensor 16, and made of elastic material; a button 18 placed on the click rubber 17; and a casing 19 which covers the silicone rubber sensor 16, the click rubber 17, and the button 18.

The silicone rubber sensor 16 is formed in an inverted shape of a bottomed cylinder and has a flange portion 16*a* at its lower end, and the electrode 15 is provided in the flange portion 16*a*. The click rubber 17 is composed of a cylindrical body 17*a* in a substantially cylindrical shape, extending portions 17*b* which extend from the cylindrical body 17*a* diagonally downward, and leg portions 17*c* disposed at lower ends of the extending portions 17*b*. The leg portions 17*c* are rigidly provided on the base board 13 and support an lower end part 19*a* of the casing 19. The button 18 consists of an upper small-diameter portion 18*a* in a cylindrical shape and a lower large-diameter portion 18*b* in a cylindrical shape. The casing 19 is in a substantially inverted shape of a bottomed cylinder and provided with an opening 19*b* in its upper end part. The opening 19*b* is larger in diameter than the upper small-diameter portion 18*a* of the button 18 and smaller in diameter than the lower large-diameter portion 18*b*. The upper small-diameter portion 18*a* is passed through the opening 19*b* so as to project upward from the upper end of the casing 19, while the lower large-diameter portion 18*b* is positioned inside the upper end part of the casing 19, and biased upward by means of the click rubber 17.

When the button 18 is pushed downward, the extending portions 17*b* of the click rubber 17 are deformed with the push motion of the button 18 and the cylindrical body 17*a* of the click rubber 17 is displaced downward. By further pushing the button 18 downward, the extending portions 17*b* are greatly deformed instantaneously as shown in FIG. 2 bringing a lower end portion 17*d* of the cylindrical body 17*a* into contact with the silicone rubber sensor 16 to press the silicone rubber sensor 16 and the resist 14 downward. From this point in time, the silicone rubber sensor 16 and the resist 14 act in the same manner as a capacitor, and generate an output between the electrode 12 and the electrode 15. As the silicone rubber sensor 16 is further pressed, the output is increased substantially in proportion to the pressing force.

FIG. 3 is a graph showing relations among a displaced amount S of the button 18, a load P of the touch which the operator of the button 18 feels, and an output V generated between the electrodes 12 and 15. When the button 18 is pushed downward and as the displaced amount S varies from 0 to S1, the load of the touch P varies from 0 to P1 substantially in proportion to the displaced amount S. However, when the displaced amount S varies from S1 to S2, the load of the touch P is abruptly decreased from P1 to P2. This is because the extending portions 17*b* of the click rubber 17 have been greatly deformed to establish a touch of a click. The more the displaced amount S is increased from S2, the more the load of the touch P is again increased from P2 substantially in proportion to the increase of the displaced amount S.

At a point in time that the displaced amount is S2, the output V in an amount of V1 is generated between the electrodes 12 and 15. The output V is further increased from the output V1 substantially in proportion to the increase of the displaced amount S. The output V actuates the electrodes 12 and 15 to generate an "on" output which is a digital output and an analog output corresponding to the push-down operation of the button 18.

Figure 4:
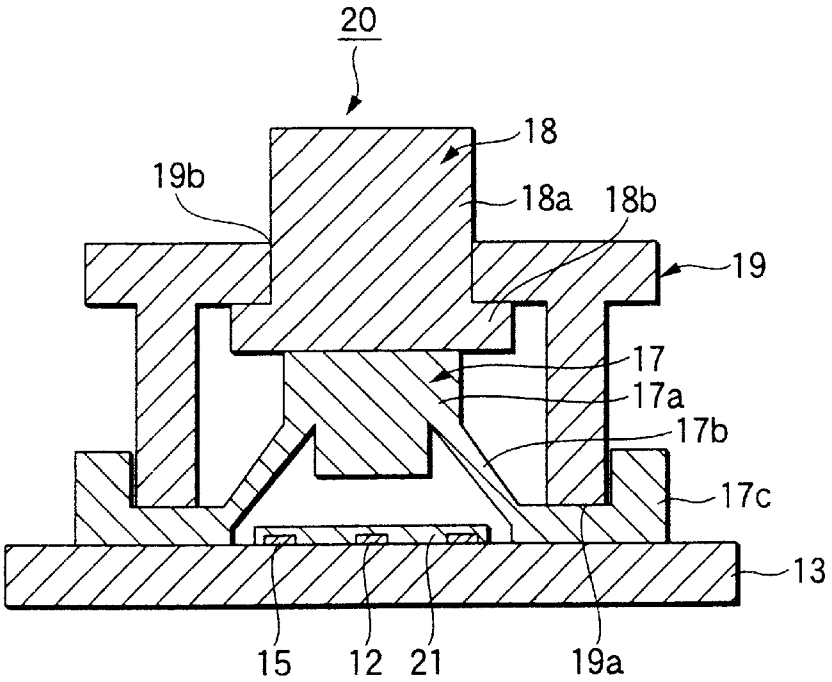
FIG. 4 is a sectional side view of an input device for the game controller according to a second embodiment of the invention.
Figure 5:
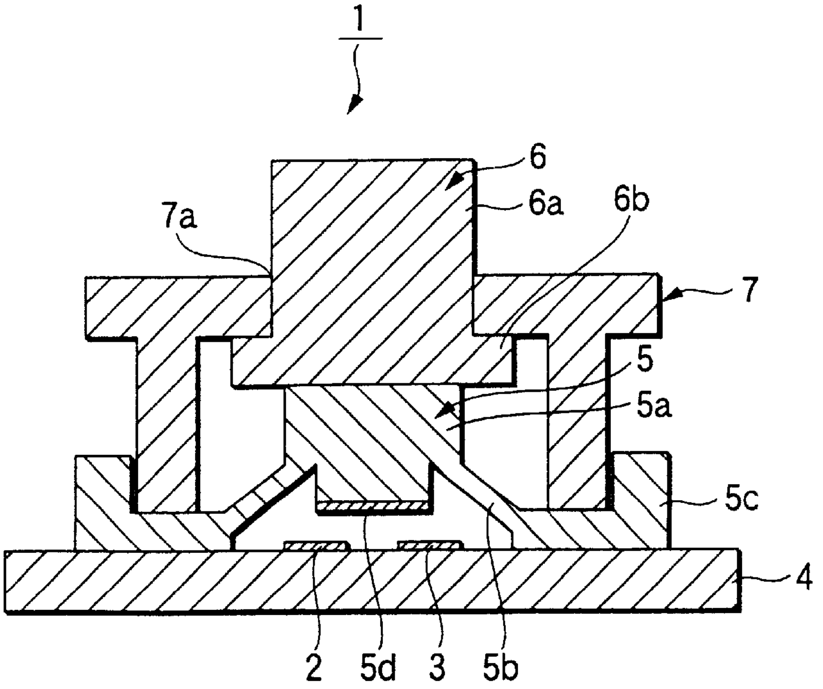
FIG.5 RELATED ART
FIG. 5 is a sectional side view of a related input device for a game controller.

FIG. 4 shows an input device 20 for a game controller according to a second embodiment of the invention. In the input device 20, there is provided a piezoelectric sensor 21 below the click rubber 17 in place of the resist 14 and the silicone rubber sensor 16 of the first embodiment. A pair of the electrodes 12 and 15 are fixed with the piezoelectric sensor 21. In this structure, when the button 18 is pushed down to deform the click rubber 17, the click rubber 17 presses the piezoelectric sensor 21 to generate an output between the electrodes 12 and 15 in the piezoelectric sensor 21. As the piezoelectric sensor 21 is further pressed, the output from the electrodes 12 and 15 is increased. Thus, in case where the piezoelectric sensor 21 is employed, the "on" output as the digital output and the analog output corresponding to the push-down operation of the button 18 can be also generated.

It is to be noted that various modifications can be added to the invention unless they deviate from the spirit of the invention, and it is apparent that the invention covers also the modifications.

What is claimed is:

1. An input device comprising:

a base board;

a first electrode disposed on the base board;

a second electrode disposed on the base board;

a resist formed on the base board so as to cover the first electrode;

a capacitance-operated silicon rubber sensor provided on the base board so as to cover the resist and the second electrode;

a click rubber disposed above the silicon rubber sensor; and a button for deforming the click rubber so as to press down the silicond rubber sensor and the resist.

2. The input device as set forth in claim 1, wherein the silicon rubber sensor and the resist generates an analog output signal between the first and second electrodes in proportion to a force pressing the button, when the pressing force is larger than a predetermined pressing force enough to deform the click rubber so as to establish the output signal.

3. An input device comprising:

a base board;

a first electrode disposed on the base board;

a second electrode disposed on the base board;

a piezoelectric sensor which covers the first and second electrodes;

a click rubber disposed above the piezoelectric sensor; and a button for deforming the click rubber so as to press down the piezoelectric sensor.

4. The input device as set forth in claim 3, wherein the piezoelectric sensor generates an analog output signal between the first and second electrodes in proportion to a force pressing the button, when the pressing force is larger than a predetermined pressing force enough to deform the click rubber so as to establish the output signal.

5. An input device comprising:

a base board;

first and second spaced apart electrodes disposed on the base board;

a button and click rubber configuration positioned away from said first and second spaced apart electrodes, and selectively moveable towards said first and second spaced apart electrodes; and a sensor positioned between said button and click rubber configuration and said first and second spaced apart electrodes, said sensor permitting electrical communication between said first and second electrodes when said button and click rubber configuration are moved towards said first and second spaced apart electrodes, and said sensor generating an analog output signal between said first and second spaced apart electrodes in proportion to a force pressing said button.

6. The input device of claim 5 wherein said sensor is a capacitance-operated silicon rubber sensor.

7. The input device of claim 5 wherein said sensor is a piezoelectric sensor.

8. The input device of claim 5 further comprising a casing which covers the first and second electrodes, the sensor, and the button and click rubber configuration.

* * * * *